(12) United States Patent
Mizusaki

(10) Patent No.: US 11,974,468 B2
(45) Date of Patent: Apr. 30, 2024

(54) DISPLAY DEVICE

(71) Applicant: SHARP KABUSHIKI KAISHA, Sakai (JP)

(72) Inventor: Masanobu Mizusaki, Sakai (JP)

(73) Assignee: SHARP KABUSHIKI KAISHA, Osaka (JP)

(*) Notice: Subject to any disclaimer, the term of this patent is extended or adjusted under 35 U.S.C. 154(b) by 475 days.

(21) Appl. No.: 17/292,432

(22) PCT Filed: Nov. 12, 2018

(86) PCT No.: PCT/JP2018/041823
§ 371 (c)(1),
(2) Date: May 8, 2021

(87) PCT Pub. No.: WO2020/100187
PCT Pub. Date: May 22, 2020

(65) Prior Publication Data
US 2022/0020832 A1    Jan. 20, 2022

(51) Int. Cl.
*H10K 59/124* (2023.01)
*H10K 50/844* (2023.01)
*H10K 50/87* (2023.01)
*H10K 71/00* (2023.01)
*H10K 30/00* (2023.01)
*H10K 77/10* (2023.01)

(52) U.S. Cl.
CPC ......... *H10K 59/124* (2023.02); *H10K 50/844* (2023.02); *H10K 50/87* (2023.02); *H10K 71/00* (2023.02); *H10K 30/671* (2023.02); *H10K 77/111* (2023.02)

(58) Field of Classification Search
CPC .... H10K 59/124; H10K 50/844; H10K 50/87; H10K 71/00; H10K 50/8445; H10K 59/12; H10K 77/111; H10K 30/671; G09F 9/30; H05B 33/02; H05B 33/04
See application file for complete search history.

(56) References Cited

U.S. PATENT DOCUMENTS

| 2005/0112874 A1* | 5/2005 | Skarp | C23C 16/403 438/680 |
| 2014/0206117 A1* | 7/2014 | Sonoda | H05B 33/28 438/29 |
| 2017/0055365 A1* | 2/2017 | Sanders | H01L 23/373 |
| 2017/0110681 A1* | 4/2017 | Shen | H10K 50/844 |
| 2018/0264784 A1 | 9/2018 | Murofushi et al. | |
| 2019/0123289 A1* | 4/2019 | Yu | H10K 50/87 |

FOREIGN PATENT DOCUMENTS

| JP | 2010147179 A | 7/2010 |
| JP | 2015019059 A | 1/2015 |
| WO | 2017/090686 A1 | 6/2017 |
| WO | 2017/221549 A1 | 12/2017 |

OTHER PUBLICATIONS

WO2017090686 (Year: 2017).*
WO2017221549 (Year: 2017).*

* cited by examiner

*Primary Examiner* — Patricia D Valenzuela
(74) *Attorney, Agent, or Firm* — ScienBiziP, P.C.

(57) ABSTRACT

A display device includes: a substrate; a TFT layer provided on the substrate; a light-emitting element layer provided on the TFT layer and including a plurality of light-emitting elements; and at least one thermal insulation layer, the thermal insulation layer containing: a cellulosic resin; and a metal oxide or a metal carbonyl compound.

19 Claims, 5 Drawing Sheets

(b)

DISPLAY DEVICE

TECHNICAL FIELD

The disclosure relates to a display device including a thermal insulation layer.

BACKGROUND ART

Light-emitting elements to be used for various display devices are low in heat resistance, and the brightness of such light-emitting elements is likely to decrease under a hot environment.

Such known display devices as, for example, a display device disclosed in Patent Document 1 below are suggested to include a heat dissipation layer provided on a surface of a support substrate of the display devices.

CITATION LIST

Patent Literature

[Patent Document 1] Japanese Unexamined Patent Application Publication No. 2010-147179

SUMMARY

Technical Problem

When the above known display devices are used under, for example, a hot environment such as the inside of a car, the heat dissipation layer does not function properly. The problem is, the heat dissipation layer might have difficulty in preventing the light-emitting element from deteriorating because of, for example, the heat generated by the light-emitting element itself.

In view of the above problem, the disclosure is intended to provide a display device capable of retarding deterioration of a light-emitting element even if the display device is used under a hot environment.

Solution to Problem

In order to achieve the above object, a display device according to the disclosure includes: a substrate; a TFT layer provided on the substrate; a light-emitting element layer provided on the TFT layer and including a plurality of light-emitting elements; and at least one thermal insulation layer. The thermal insulation layer containing: a cellulosic resin; and a metal oxide or a metal carbonyl compound.

Advantageous Effects of Invention Disclosure

An aspect of the disclosure can provide a display device capable of retarding deterioration of a light-emitting element even if the display device is used under a hot environment.

DESCRIPTION OF EMBODIMENT

Summary of Production Method and Configuration of Display Device

Described below in detail is a method for producing a display device according to an embodiment of the disclosure, with reference to FIGS. 1 and 2. In the description below, the term "same layer" means that constituent features are formed in the same process (in the same film deposition process). The term "lower layer (or layer below)" means that a constituent feature is formed in a previous process before a comparative layer is formed. The term "upper layer (or layer above)" means that a constituent feature is formed in a successive process after a comparative layer is formed.

Figure 1:
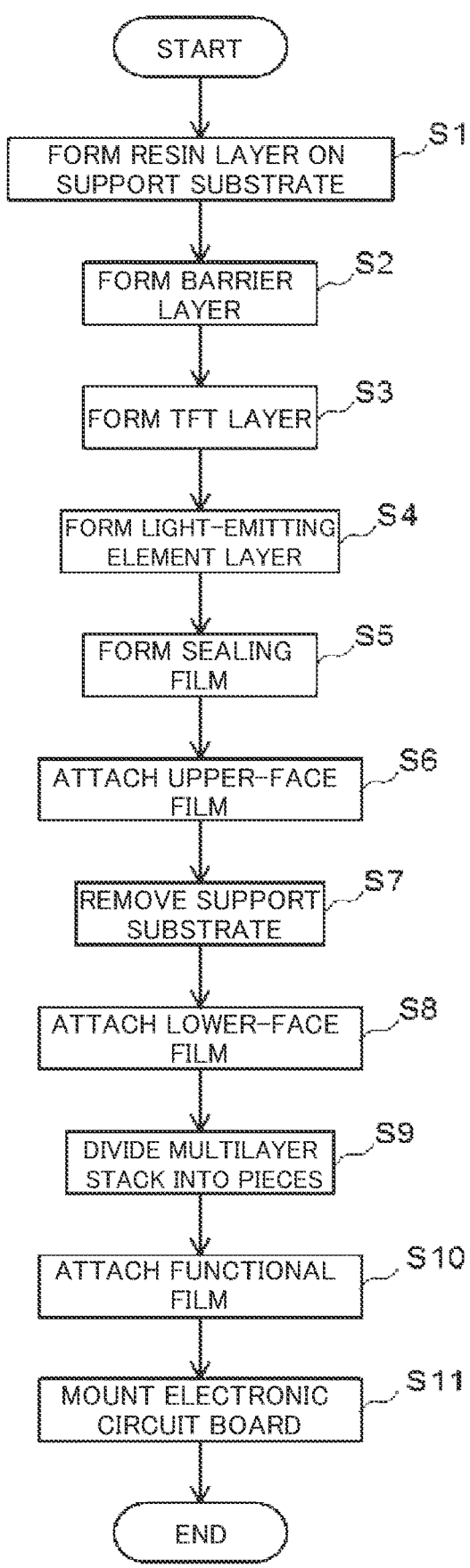
FIG. 1 is a flowchart illustrating an example of a method for producing a display device according to an embodiment of the disclosure.

FIG. 1 is a flowchart illustrating an example of a method for producing a display device according to an embodiment of the disclosure. FIG. 2 is a cross-sectional view illustrating a configuration example of a display region of the display device.

Figure 2:
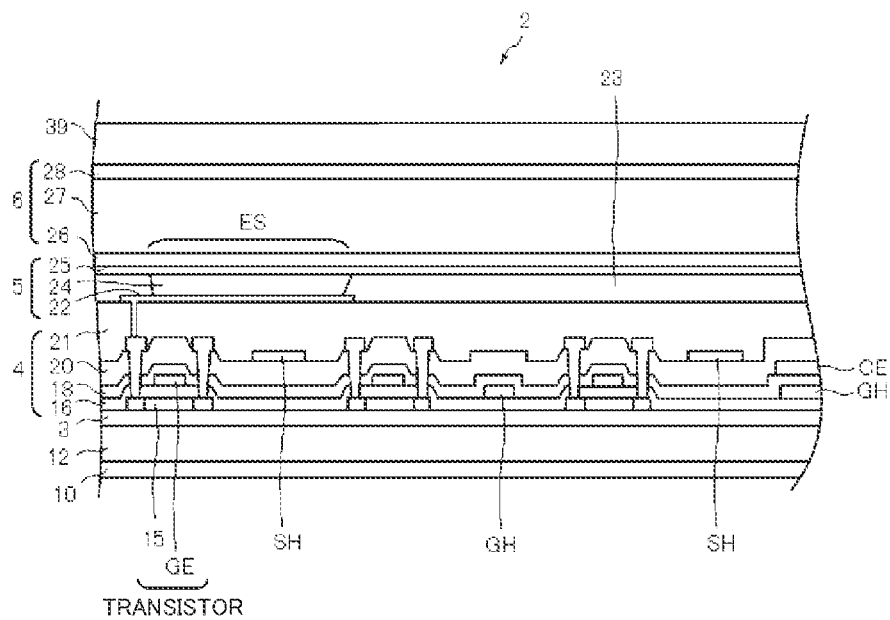
FIG. 2 is a cross-sectional view illustrating a configuration example of a display region of the display device.

In producing a flexible display device, at Step S1 as illustrated in FIGS. 1 and 2, a resin layer 12 is formed on a light-transparent support substrate (e.g. a mother glass). At Step S2, a barrier layer 3 is formed as a moisture proof film to cover the resin layer 12. At Step S3, a thin-film transistor (TFT) layer 4 is formed. At Step S4, a light-emitting element layer 5 of a top emission type is formed. At Step S5, a sealing film 6 is formed. At Step S6, an upper-face film 39 is attached to the sealing film 6.

At Step S7, the support substrate is removed from the resin layer 12 with, for example, a laser beam emitted on the support substrate. At Step S8, a lower-face film 10 is attached to a lower face of the resin layer 12. At Step S9, a multilayer stack including the lower-face film 10, the resin layer 12, the barrier layer 3, the TFT layer 4, the light-emitting element layer 5, and the sealing film 6 is divided into a plurality of pieces. At Step S10, to each of the obtained pieces, a functional film is attached. At Step S11, an electronic circuit board (e.g. an IC chip and a flexible printed circuit, or an FPC) is mounted on a portion of the outside (a non-display region; namely, a frame region) of a display region in which a plurality of sub-pixels are formed. Note that Steps S1 to S11 are executed by a display device production apparatus (including a deposition apparatus executing each of Steps S1 to S5).

The resin layer 12 is a flexible substrate (a substrate) of a display device 2. Other than the resin layer 12, for example, a glass substrate may be used as the substrate of the display device 2. Example materials of the resin layer 12 include at least one resin selected from a group of polyimide, polyamide, polyester, and acrylic resin. Other than the example materials, the resin layer 12 may be made of a double-layer resin film (e.g. polyimide films), and of an inorganic insulating film sandwiched between these resin films.

The barrier layer 3 prevents such foreign objects as water and oxygen from reaching the TFT layer 4 and the light-emitting element layer 5. An example of the barrier layer 3 includes a silicon oxide film, a silicon nitride film, or a silicon oxide nitride film formed by chemical-vapor deposition (CVD), or a multilayer film including these films.

The TFT layer 4 includes: a semiconductor film 15; an inorganic insulating film (a gate insulating film) 16 above the semiconductor film 15; a gate electrode GE and a gate wire GH above the inorganic insulating film 16; an inorganic insulating film 18 above the gate electrode GE and the gate wire GH; a capacitance electrode CE above the inorganic insulating film 18; an inorganic insulating film 20 above the capacitance electrode CE; a source wire SH above the inorganic insulating film 20; and a planarization film 21 (an interlayer insulating film) above the source wire SH.

The semiconductor film 15 is formed of, for example, low-temperature polysilicon (LTPS) or an oxide semiconductor (e.g. an In—Ga—Zn—O-based semiconductor). A thin-film transistor (TFT) is formed to contain the semiconductor film 15 and the gate electrode GE. In FIG. 2, the TFT is illustrated as a top-gate TFT. Alternatively, the TFT may be a bottom-gate TFT.

The gate electrode GE, the gate wire GH, the capacitance electrode CE, and the source wire SH are each formed of a metal monolayer film or a metal multilayer film including at least one of, for example, aluminum, tungsten, molybdenum, tantalum, chromium, titanium, and copper. The TFT layer 4 in FIG. 2 includes a monolayer semiconductor layer and a three-layer metal layer.

The inorganic insulating films 16, 18, and 20 can be, for example, a silicon oxide (SiOx) film, or a silicon nitride (SiNx) film formed by the CVD, or a multilayer film including these films. The planarization film 21 may be made of an applicable organic material such as polyimide and acrylic.

The light-emitting element layer 5 includes: an anode 22 above the planarization film 21; an edge cover 23 having insulation properties and covering an edge of the anode 22; an electroluminescence (EL) layer 24 above the edge cover 23; and a cathode 25 above the EL layer 24. The edge cover 23 is formed of, for example, an organic material such as polyimide and acrylic. The organic material is applied, and then patterned by photolithography to form the edge cover 23.

For each of the sub-pixels, the light-emitting element layer 5 is provided with a light-emitting element ES (e.g., an organic light-emitting diode (OLED) or a quantum dot light-emitting-diode (QLED)) including: the anode 22 and the EL layer 24 each shaped into an island; and the cathode 25. The TFT layer 4 is provided with a sub-pixel circuit controlling the light-emitting element ES.

The EL layer 24 includes, for example, a hole-injection layer, a hole-transport layer, a light-emitting layer, an electron-transport layer, and an electron-injection layer stacked on top of an other in the stated order from below. The light-emitting layer is shaped into an island, and formed in an opening of the edge cover 23 (for each sub pixel) by vapor deposition or ink-jet printing. The other layers are shaped into islands or a monolithic form. Moreover, the EL layer 24 may omit one or more of the hole-injection layer, the hole-transport layer, the electron-transport layer, and the electron-injection layer.

In vapor-depositing to form a light-emitting layer of the OLED, a fine metal mask (FMM) is used. The FMM is a sheet (e.g. invar) including many openings. Organic material passing through one opening forms a light-emitting layer (corresponding to one sub-pixel) shaped into an island.

A light-emitting layer of the QLED is formed of, for example, a solvent into which quantum dots are dispersed. The solvent is applied by ink-jet printing to form the light-emitting layer (corresponding to one sub-pixel) shaped into an island.

The anode (a positive electrode) 22 is formed of, for example, indium tin oxide (ITO), and silver (Ag) or an alloy including Ag stacked on top of each other. The anode 22 reflects light. The cathode (a negative electrode) 25 can be formed of a light-transparent conductive material such as an MgAg alloy (an ultra-thin film), ITO, and indium zinc oxide (IZO).

If the light-emitting element ES is the OLED, holes and electrons recombine together in the light-emitting layer by a drive current between the anode 22 and the cathode 25, which forms an exciton. While the exciton transforms to the ground state, light is emitted. Because the cathode 25 is transparent to light and the anode 22 is light-reflective, the light emitted from the EL layer 24 travels upward. This is how the light-emitting element layer 5 is of a top emission type.

If the light-emitting element ES is the QLED, holes and electrons recombine together in the light-emitting layer by a drive current between the anode 22 and the cathode 25, which forms an exciton. While the exciton transforms from the conduction band level to the valence band level, light (fluorescence) is emitted.

The light-emitting element layer 5 may include a light-emitting element (e.g. an inorganic light-emitting diode) other than the OLED and the QLED.

The sealing film 6 is transparent to light, and includes: an inorganic sealing film 26 (a first inorganic insulating layer) covering the cathode 25; an organic buffer film 27 (an organic insulating layer) above the inorganic sealing film 26; and an inorganic sealing film 28 (a second inorganic insulating layer). The sealing film 6 covering the light-emitting element layer 5 prevents such foreign objects as water and oxygen from penetrating into the light-emitting element layer 5.

The inorganic sealing films 26 and 28 are both inorganic insulating layers. An example of the inorganic sealing films 26 and 28 includes a silicon oxide film, a silicon nitride film, or a silicon oxide nitride film formed by the CVD, or a multilayer film including these films. The organic buffer film 27 is an organic insulating layer transparent to light and providing a planarized face. The organic buffer film 27 may be made of an applicable organic material such as acrylic. The organic buffer film 27 can be formed by, for example, inkjet printing. The non-display region may be provided with a bank to block droplets. The inorganic sealing film 26, the organic buffer film 27, and the inorganic sealing film 28 are stacked on top of an other in the stated order from the light-emitting element layer 5.

The lower-face film 10 is, for example, a polyethylene terephthalate (PET) film attached to the lower face of the resin layer 12 with an adhesive layer 51 (see FIG. 3) after the support substrate is removed. Thanks to the lower-face film 10, the display device excels in flexibility. The functional film, which is replaced with the upper-face film 39 and attached to the sealing film 6, has at least one of such functions as optical compensation, touch sensing, and protection.

Described above is a flexible display device. In the case where an inflexible display device is produced, steps such as forming a resin layer and replacing a base material are usually unnecessary. Hence, for example, the glass substrate undergoes stacking steps such as Steps S2 to S5, and after that, the production process proceeds to Step S9.

Described in the embodiments below is an example of a structure of the display device 2. Throughout the embodiments, features described in a preceding embodiment will not be elaborated upon in a succeeding embodiment.

First Embodiment

Figure 3:
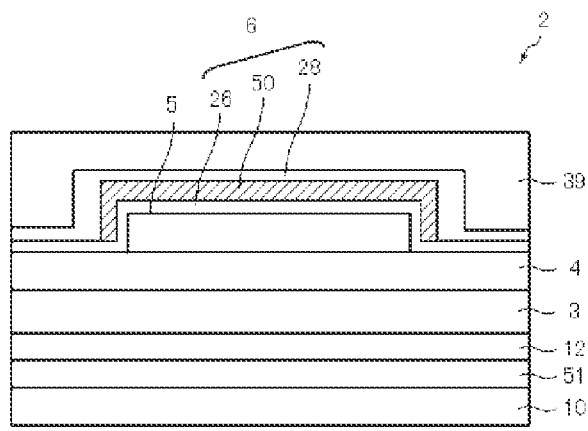
FIG. 3 is a cross-sectional view illustrating a schematic configuration of a display device according to a first embodiment of the disclosure.

FIG. 3 is a cross-sectional view illustrating a schematic configuration of a display device according to a first embodiment of the disclosure.

As illustrated in FIG. 3, for example, the display device 2 according to this embodiment includes a thermal insulation layer 50 provided around the light-emitting element ES to insulate the light-emitting element layer 5 against heat outside. The display device 2 illustrated in FIG. 3 is the one illustrated in FIG. 2 in which the organic buffer film 27, of the sealing film 6 covering the light-emitting element layer 5, uses the thermal insulation layer 50. That is, in this embodiment, the organic buffer film 27 is the thermal insulation layer 50, and serves as both an organic buffer film and a thermal insulation layer. This thermal insulation layer 50 is formed when the sealing film 6 is formed in above Step S5. (See the details later.)

The thermal insulation layer 50 is made of a composite material containing: a cellulosic resin (a cellulosic polymer) that is a binder resin (a matrix resin); and a metal oxide or a metal carbonyl compound. Moreover, in the thermal insulation layer 50, the metal oxide or the metal carbonyl compound is dispersed into the cellulosic resin.

The cellulosic resin is, for example, a polymer having main chains (a repeating structure) and side chains illustrated in a structural formula (1) below. This cellulosic resin is a transparent material, and causes no reduction in visibility of the display device 2 even if disposed to the display surface (e.g. the organic buffer film 27) of the display device 2 as the thermal insulation layer 50.

[Formula 1]

In above Formula (1), the repetitions represented by "n" preferably range from 100 to 3,000, and more preferably 300 to 1,000. This is because if the degree of polymerization is excessively low, the heat resistance of the cellulosic resin is not sufficient. If the degree of polymerization is excessively high, the viscosity of the cellulosic resin is excessively high when the cellulosic resin is applied by such a solution application technique as ink-jet printing, making it difficult to control the thickness of the cellulosic resin.

Furthermore, a weight-average molecular weight of the cellulosic resin preferably ranges from 15,000 to 5,000,000, and more preferably 10,000 to 1,500,000. This is because if the degree of polymerization is excessively low, the heat resistance of the cellulosic resin is not sufficient. If the degree of polymerization is excessively high, the viscosity of the cellulosic resin is excessively high when the cellulosic resin is applied by such a solution application technique as ink-jet printing, making it difficult to control the thickness of the cellulosic resin.

Moreover, the cellulosic resin is more rigid and heat-resistant than a vinyl resin and a phenylene resin, and is less likely to cause molecular vibration than a vinyl resin and a phenylene resin do. Specifically, the cellulosic resin is resistant to a temperature of, for example, 100° C. or higher, and exhibits no variation in conformation under an environment at a temperature of 100° C. or higher. For the most severe on-board usage, a typical requirement level of heat resistance is a temperature of 95° C. The cellulosic resin resistant to a temperature of 100° C. or higher is suitable as a binder resin (a matrix resin). Furthermore, the cellulosic resin can be applied by such a solution application technique as ink-jet printing.

The metal oxide or the metal carbonyl compound contains any one of such metals as Mo, W, Ta, and Nb as a thermal insulating metal.

Furthermore, the metal oxide or the metal carbonyl compound is made of a material well compatible with the cellulosic resin. Dispersed into the cellulosic resin, the metal oxide or the metal carbonyl compound achieves a high thermal insulating effect. As can be seen, this embodiment makes it possible to retard the deterioration of the light-emitting element ES even if applied under a hot environment. (Details will be described later.)

Specifically, an example of the metal oxide is $MoO_x$ ($3 \geq x > 0$), $NbO_y$ ($3 \geq x > 0$), or $TaO_z$ ($3 \geq z > 0$). These metal oxides are well compatible with an oxygen group and a hydroxyl group contained in the cellulosic resin, and can be uniformly dispersed into the cellulosic resin. Moreover, an example of the metal carbonyl compound is $W(CO)_6$ or $Ta(Co)_5$. These metal carbonyl compounds are well compatible with an oxygen group contained in the cellulosic resin, and can be uniformly dispersed into the cellulosic resin.

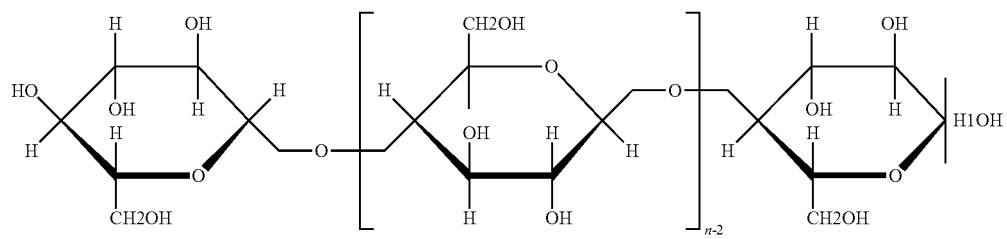

(where "n" is an integer of 50 to 6,000.)

That is, the thermal insulation layer 50 is made of a composite material illustrated in a structural formula (2) below.

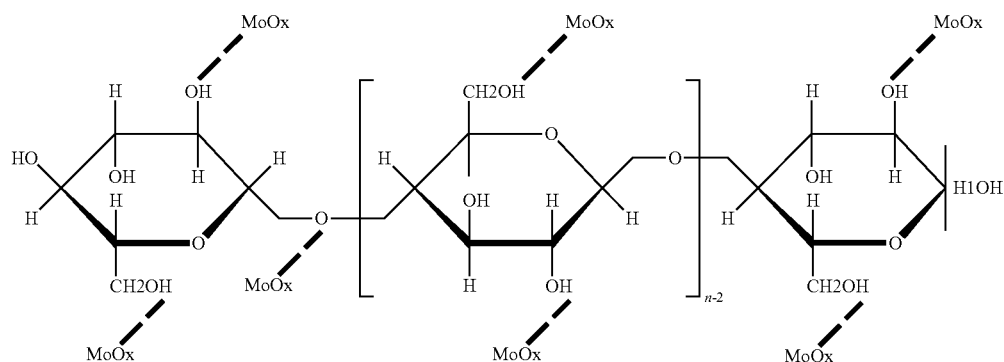

[Formula 2]

In the structural formula (2), the repetitions represented by "n" are the same as those in the structural formula (1). Moreover, as the dotted lines show in the structural formula (2), the metal oxide $MoO_x$ bonds by hydrogen or the Van der Waals force to the oxygen group and the hydroxyl group contained in the cellulosic resin.

Moreover, in the thermal insulation layer 50, a content of the metal oxide or the metal carbonyl compound with respect to the cellulosic resin preferably ranges from 3 to 20 wt %. When the metal oxide or the metal carbonyl compound is mixed with the cellulosic resin in the above range of the content, the thermal insulation layer 50 to be obtained can achieve a sufficient thermal insulating effect and a high transmittance without such adverse effects as scattering light. Thanks to such features, the display device 2 can excel in brightness characteristic and retard deterioration of the light-emitting element ES. Note that if the content of the metal oxide or the metal carbonyl compound is less than 3 wt %, the thermal insulating effect decreases. Meanwhile, if the content of the metal oxide or the metal carbonyl compound is more than 20 wt %, display characteristics (e.g. contrast) of the display device 2 could be adversely affected because of, for example, scattering light.

A thickness of the thermal insulation layer 50 shall not be limited to a particular one. In order to avoid an excessive decrease in thermal insulating effect due to a decrease in thickness of the thermal insulation layer 50 and to avoid a decrease in light intensity due to an increase in thickness of the thermal insulation layer 50, the thickness of the thermal insulation layer 50 may be 20 nm or more and 1,000 nm or less, and, more preferably, 100 nm or more and 300 nm or less in view of achieving a thermal insulating effect and curbing a decrease in light intensity.

An example of the thermal insulation layer 50 is formed of a solution prepared from a solvent with a cellulosic resin dissolved into the solvent. A metal oxide or a metal carbonyl compound is added to the solution and stirred well and uniformly mixed together so that a mixture is obtained. The obtained mixture is applied to a base layer. The base layer is fired and the solvent is removed (evaporated), so that the thermal insulation layer 50 is finalized.

The light-emitting element ES deteriorates more significantly when operating under a hot environment than when simply left under the hot environment. Hence, a boiling point, a firing temperature, and a firing time period of the solvent shall not be limited to particular ones.

Hence, the solvent may be an organic solvent that can dissolve the cellulosic resin. In order to reduce damage to the light-emitting element ES by heat and to shorten a time period to form the thermal insulation layer 50, the organic solvent preferably has the lowest boiling point possible. Examples of the solvent include ethanol, N-Methyl-2-pyrrolidone (NMP), and butyl cellosolve.

Moreover, the firing temperature and the firing time period may be set appropriately to any given temperature and time period to remove the solvent, depending on, for example, a kind and an amount of the solvent. As an example, the substrate with the mixture applied thereto is preliminarily dried approximately at, for example, 90° C. for, for example, five minutes. After that, the substrate may be subjected to main firing at, for example, 140° C. with an oven for, for example, five minutes.

Note that the temperature of the main firing may be any given temperature as long as the solvent evaporates. Preferably, the temperature is 140° C. or above and 220° C. or below. If the temperature of the main firing is below 140° C., the solvent might not be completely removed, depending on a kind of the solvent. The left solvent acts as an impurity, possibly causing the risk of deteriorating characteristics of the light-emitting element ES. Meanwhile, if the temperature of the main firing is above 220° C., the temperature of the oven is usually unstable. As a result, the quality of the film (the thermal insulation layer 50) is less likely to be homogeneous.

Note that the amount of the cellulosic resin to be added to the solvent may be set appropriately to any given amount so that the mixture has a desired viscosity. For example, the amount may be set so that the content of the cellulosic resin in the solution preferably ranges from 1 to 30 wt %, and more preferably from 3 to 10 wt %.

The viscosity of the mixture may be any given viscosity. In order to readily stir the mixture and apply the mixture to the base layer, the viscosity of the mixture may preferably range from 0.1 cP to 20 cP, and more preferably from 1 cP to 10 cP. In particular, if the mixture is applied by ink-jet printing, the viscosity of the mixture may preferably range from 1 to 10 cP, and more preferably from 1.5 to 8 cP. Note that the mixture may be applied by, for example, spin coating instead of ink-jet printing.

The thermal insulation layer 50 according to this embodiment may be formed in the forming of the sealing film 6 at Step S5. Here, the inorganic sealing film 26 covering the cathode 25 is used as the above base layer. The inorganic sealing film 26 is coated with the mixture by, for example, ink-jet printing and fired so that the thermal insulation layer 50 is finalized.

In accordance with this embodiment, the sealing film 6 (more specifically, the organic buffer film 27 of the sealing film 6) can insulate the light-emitting element ES against heat outside. In this embodiment, the thermal insulation layer 50 is formed to cover the light-emitting element ES to insulate the light-emitting element ES against heat outside reaching the light-emitting element ES from above.

First Modification of First Embodiment

Note that, as described above, the sealing film 6 may include multilayer including multiple sets of an organic buffer film vertically sandwiched with inorganic sealing films stacked on top of an other. Hence, the sealing film 6 may include a plurality of the thermal insulation layers 50.

Second Embodiment

Figure 4:
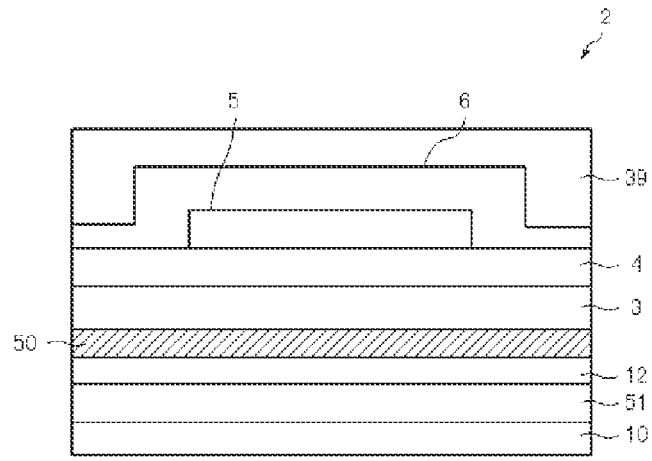
FIG. 4 is a cross-sectional view illustrating a schematic configuration of the display device according to a second embodiment of the disclosure.

FIG. 4 is a cross-sectional view illustrating a schematic configuration of the display device according to a second embodiment of the disclosure.

As illustrated in FIG. 4, the thermal insulation layer 50 may be formed below the TFT layer 4. The display device 2 according to this embodiment is the one illustrated in FIG. 2 in which the thermal insulation layer 50 is not included in the organic buffer film 27 but provided between the resin layer 12 and the barrier layer 3 (the moisture proof film) covering the resin layer 12. Other than this structure, the display device 2 according to this embodiment is the same as that according to the first embodiment.

This display device 2 can be formed as follows: At Step S1, the resin layer 12 is formed. After that, the resin layer 12 as the base layer is coated by, for example, ink-jet printing with the mixture containing a cellulosic resin and a metal oxide or a metal carbonyl compound. The resin layer 12 is fired so that the display device 2 is finalized.

This embodiment makes it possible to insulate the display device 2 against outside heat entering from below the barrier layer 3; that is, from the substrate. Moreover, if the display device 2 in this embodiment is of, for example, a top emission type, the thermal insulation layer 50 is positioned away from emitting light in relation to the light-emitting element layer 5. Such a feature makes it possible to increase the thickness of the thermal insulation layer 50. Hence, if the thermal insulation layer 50 is positioned away from emitting light in relation to the light-emitting element layer 5, the thermal insulation layer 50 can be formed to have a thickness of 500 nm or more. Thus, this embodiment can further increase the thermal insulating effect of the thermal insulation layer 50. Note that if the thermal insulation layer 50 has a thickness of more than 1,000 nm, the thin-screen display might lose an advantage of its thinness. Hence, the thermal insulation layer 50 preferably has a thickness of 1,000 nm or less.

First Modification of Second Embodiment

Figure 5:
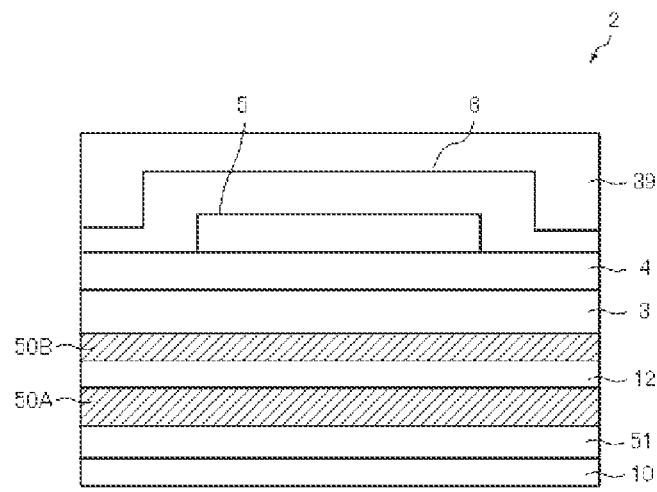
FIG. 5 is a cross-sectional view illustrating a schematic configuration of the display device according to a first modification of the second embodiment.

FIG. 5 is a cross-sectional view illustrating a schematic configuration of the display device according to a first modification of the second embodiment.

The thermal insulation layer 50 may include two or more thermal insulation layers. FIG. 5 illustrates an example of the thermal insulation layer 50 including a thermal insulation layer 50A formed on a lower face of the resin layer 12 and thermal insulation layer 50B formed on an upper face of the resin layer 12.

Note that the thermal insulation layers 50A and 50B are the same as the thermal insulation layer 50 described above, and the details thereof will not be elaborated upon here. As described above, if the display device 2 includes two or more thermal insulation layers 50, the thermal insulation layers 50A and 50B may be the same, or different, in thickness.

The display device 2 illustrated in FIG. 5 can be formed as follows: an upper face and a lower face of such a base substrate as a polyimide substrate (the resin layer 12) is coated by, for example, ink-jet printing with a material of the thermal insulation layer 50; that is, the mixture containing a cellulosic resin and a metal oxide or a metal carbonyl compound. After that, the solvent is removed so that the display device 2 is finalized.

Second Modification of Second Embodiment

The thermal insulation layer 50 may be a base substrate. Hence, unlike the illustration in FIG. 4, the thermal insulation layer 50 may be provided not separately from the resin layer 12, but formed as the resin layer 12 illustrated in FIG. 2. The base substrate (the resin layer 12), which serves as the thermal insulation layer 50, can reduce an increase in the number of the parts of the display device 2 caused when the thermal insulation layer 50 is formed separately from the base substrate (the resin layer 12).

Here, at Step S1, a light-transparent support substrate (e.g. a mother glass) may be used as a base layer. On the support substrate, the above thermal insulation layer 50 may be formed as the resin layer 12. Such a feature makes it possible to produce the display device 2 including the thermal insulation layer 50 as the base substrate (the resin layer 12).

Third Modification of Second Embodiment

If the display device 2 is not a flexible substrate, the thermal insulation layer 50 may be formed, for example, between such a substrate as a glass substrate and the TFT layer 4.

Any of the first to fourth modifications of the second embodiment makes it possible to insulate the display device 2 against outside heat entering from the substrate. Moreover, if the display device 2 in any of the first to fourth modifications of the second embodiment is of, for example, a top emission type, the thermal insulation layer 50 is positioned away from emitting light in relation to the light-emitting element layer 5. Hence, the thermal insulation layer 50 can be formed thick. Thus, any of the first to fourth modifications of the second embodiment makes it possible to further increase the thermal insulating effect of the thermal insulation layer 50.

Third Embodiment

Figure 6:
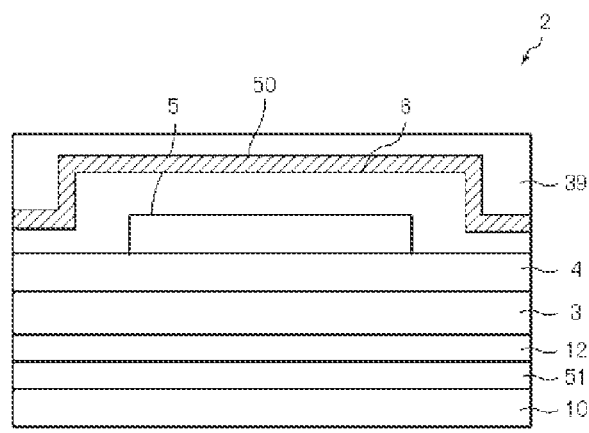
FIG. 6 is a cross-sectional view illustrating a schematic configuration of the display device according to a third embodiment of the disclosure.

FIG. 6 is a cross-sectional view illustrating a schematic configuration of the display device according to a third embodiment of the disclosure.

As illustrated in FIG. 6, in the display device 2 according to this embodiment, the thermal insulation layer 50 is formed on the sealing film 6 to cover the light-emitting element layer 5. Other than this structure, the display device 2 according to this embodiment is the same as that according to the first embodiment.

This display device 2 can be formed as follows: At Step S5, the sealing film 6 is formed. After that, as the base layer, the sealing film 6 is coated by, for example, ink-jet printing with the mixture containing a cellulosic resin and a metal oxide or a metal carbonyl compound. The sealing film 6 is fired so that the display device 2 is finalized.

This embodiment makes it possible to insulate the display device 2 against outside heat entering from above the light-emitting element ES. Moreover, in the display device 2 according to this embodiment, the thermal insulation layer 50 is formed to surround the light-emitting element layer 5, further increasing an effect of stabilizing the temperature inside the light-emitting element layer 5. Hence, within the scope of the embodiments, the display device 2 according to this embodiment is readily insulated from heat even with the thermal insulation layer 50 that is relatively thin, or relatively low in content of a metal oxide or a metal carbonyl compound.

Fourth Embodiment

Figure 7:
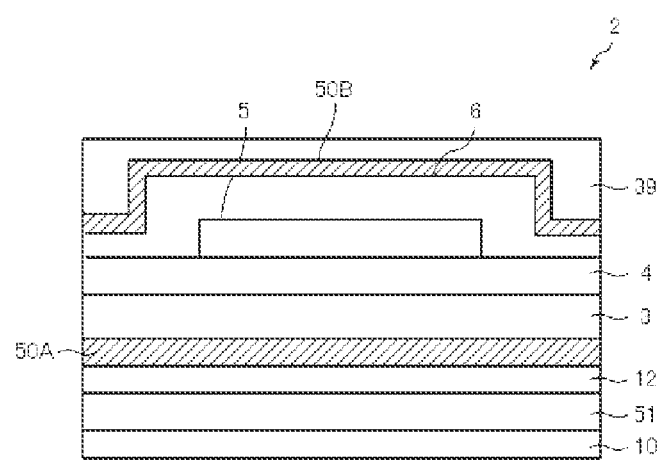
FIG. 7 is a cross-sectional view illustrating a schematic configuration of the display device according to a fourth embodiment of the disclosure.

FIG. 7 is a cross-sectional view illustrating a schematic configuration of the display device according to a fourth embodiment of the disclosure.

As illustrated in FIG. 7, in the display device 2 according to this embodiment, the thermal insulation layer 50 includes: the thermal insulation layer 50A formed between the resin layer 12 and the barrier layer 3; and the thermal insulation layer 50B formed between the scaling film 6 and the upper-face film 39. Other than this structure, the display device 2 according to this embodiment is the same as that according to the first embodiment.

Note that the thermal insulation layer 50A is the same as the thermal insulation layer 50 according to the second embodiment, and the thermal insulation layer 50B is the same as the thermal insulation layer 50 according to the third embodiment. Hence, the details of the thermal insulation layer 50A and 50B will not be elaborated upon here. Note that, also in this embodiment, the thermal insulation layers 50A and 50B may be the same, or different, in thickness.

The display device 2 according to this embodiment can insulate itself against outside heat entering from below the barrier layer 3; that is, from the substrate. The display device 2 can also insulate the light-emitting element ES against outside heat entering from above the light-emitting element ES. In this embodiment, the light-emitting element layer 5 is sandwiched between the thermal insulation layers 50A and 50B so that the thermal insulation layers 50A and 50B completely surround the light-emitting element layer 5. Such a feature can achieve a greater thermal insulating effect than that of the first to third embodiments.

Fifth Embodiment

Figure 8:
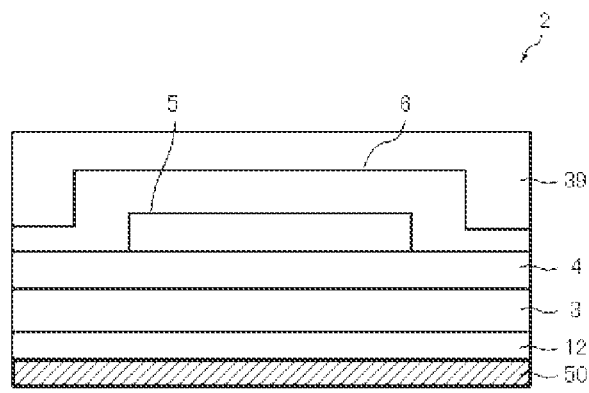
FIG. 8 is a cross-sectional view illustrating a schematic configuration of the display device according to a fifth embodiment of the disclosure.

FIG. 8 is a cross-sectional view illustrating a schematic configuration of the display device according to a fifth embodiment of the disclosure.

As illustrated in FIG. 8, the display device 2 according to this embodiment is the one illustrated in FIG. 2. Here, the thermal insulation layer 50 is not included in the organic buffer film 27, but formed on a face, of the resin layer 12 serving as a base substrate, away from a face of the TFT layer 4. Note that the thermal insulation layer 50 may also serve as the lower-face film 10. A face, of the thermal insulation layer 50, away from the resin layer 12 may be provided with the adhesive layer 51 and the lower-face film 10.

The above display device 2 can be formed, for example, as follows: At Step S5, the sealing film 6 is formed. At Step S6, the upper-face film 39 is attached to the sealing film 6. At Step S7, the support substrate is removed from the resin layer 12. After that, as the base layer, the lower face of the resin layer 12 is coated by, for example, ink-jet printing with the mixture containing a cellulosic resin and a metal oxide or a metal carbonyl compound. The resin layer 12 is fired so that the display device 2 is finalized.

Thus, while being deposited, the thermal insulation layer 50 can be kept from heat generated when the sealing film 6 is formed. Moreover, this embodiment makes it possible to insulate the display device 2 against outside heat entering from below the barrier layer 3; that is, from the substrate. Furthermore, if the display device 2 in this embodiment is of, for example, a top emission type, the thermal insulation layer 50 is positioned away from emitting light in relation to the light-emitting element layer 5. Thanks to the feature, the thermal insulation layer 50 also in this embodiment can be formed thick as seen in, for example, the second embodiment.

In addition, if, for example, the thermal insulation layer 50 also serves as the lower-face film 10, forming such a thermal insulation layer 50 makes it possible to reduce an increase in the number of the parts of the display device 2.

Sixth Embodiment

Figure 9:
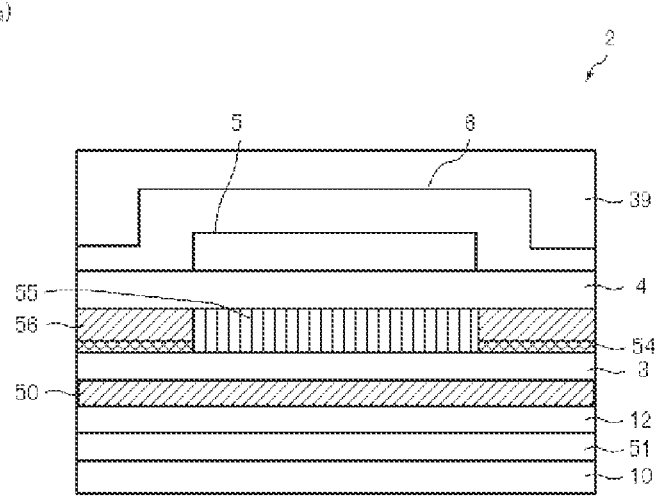
FIG. 9 is a drawing illustrating the display device according to a sixth embodiment of the disclosure. An illustration (a) in FIG. 9 is a cross-sectional view showing a schematic configuration of the display device, and an illustration (b) in FIG. 9 is a plan view showing a schematic configuration of the display device.
Figure 9:
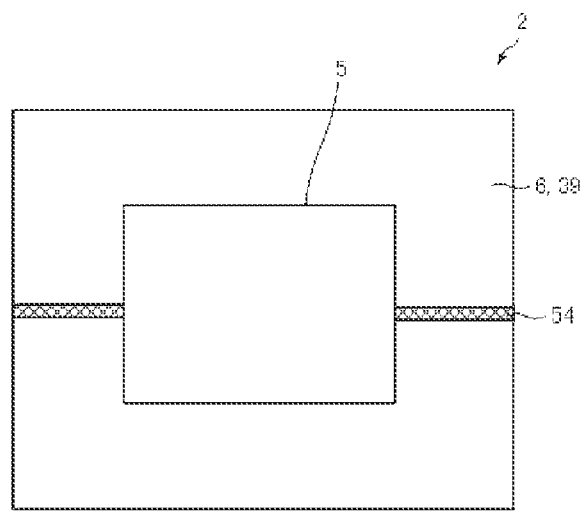

FIG. 9 is a drawing illustrating the display device according to a sixth embodiment of the disclosure. An illustration (a) in FIG. 9 is a cross-sectional view showing a schematic configuration of the display device, and an illustration (b) in FIG. 9 is a plan view showing a schematic configuration of the display device.

The display device 2 of this embodiment is, for example, the one according to the first embodiment. As shown in the illustration (a) of FIG. 9, the display device 2 includes: a heat dissipation layer 55 dissipating heat from the light-emitting element layer 5 toward outside; and a thermal insulation layer 56 surrounding the heat dissipation layer 55 in plan view. In this embodiment, the TFT layer 4 is formed between the heat dissipation layer 55 and the light-emitting element layer 5.

The thermal insulation layer 56 is formed in the same layer as the heat dissipation layer 55 is. The thermal insulation layer 56 is formed in the same manner as the heat dissipation layer 50 is. The thermal insulation layer 56 is formed of the same material as the heat dissipation layer 50 is. Note that the thermal insulation layer 50 and the thermal insulation layer 56 may be formed of either the same material or different materials.

The heat dissipation layer 55 contains a resin and inorganic fine particles dispersed into the resin. Examples of the resin include an acrylic resin, polyimide, polyester, and a polyamide resin. Of these examples, the acrylic resin is most desirable in view of heat dissipation. Moreover, when the acrylic resin is used, the monomers photo-polymerized to form a film. Thus, the acrylic resin is easy to handle in view of processing.

The inorganic fine particles contained in the resin have a diameter ranging preferably from 5 to 100 nm, and more preferably from 10 to 30 nm. If the diameter of the inorganic fine particles is smaller than 5 nm, the heat dissipation effect might not be sufficient. Meanwhile, if the diameter of the inorganic fine particles is larger than 100 nm, the inorganic fine particles are less likely to disperse into, and might separate from, the resin. Moreover, if the inorganic fine particles having a diameter of smaller than 5 nm are introduced into the resin at high concentration, the inorganic fine particles consequently agglutinate and might separate from the resin.

An example of the inorganic fine particles is of at least one kind selected from a group of such a substance as silver, copper, aluminum, magnesium, tin, and silicon, and an oxide of the substance. The inorganic fine particles readily disperse into an acrylic resin because of an intermolecular force between the inorganic fine particles and the acrylic resin. As a result, the inorganic fine particles uniformly disperse into the acrylic resin, forming the heat dissipation layer 55 having a high heat dissipation effect. That is why the heat dissipation layer 55 improves in heat dissipation and functions appropriately. Such a feature can consequently keep the light-emitting element ES from deterioration due to, for example, heat generated by the light-emitting element ES itself.

In the heat dissipation layer 55, a content of the inorganic fine particles with respect to the acrylic resin preferably ranges from 5 to 40 wt %. Because the size of the inorganic fine particles is within the above range, an induced dipolar interaction occurs between: an "O" group (an ester group, a carbonyl group, or an ether group) and an "N" group (amine) included in the acrylic resin; and the above metal capable of dissipating heat. Such a feature can achieve a sufficient heat dissipation effect, and can uniformly disperse the inorganic fine particles into the acrylic resin. Furthermore, the metal capable of dissipating heat might allow an oxide film to be formed on the surface of the metal itself. Here, in particular, the "O" group and the metal contained in the acrylic resin show excellent compatibility.

The heat dissipation layer 55 has any given thickness. In view of absorbing heat generated inside the light-emitting element layer 5 and of keeping the thermal insulating effect from decreasing, the thickness of the heat dissipation layer 55 is preferably 20 nm or more and 1,000 nm or less, and more preferably 100 nm or more and 300 nm or less.

In addition to the above features, the display device 2 according to this embodiment further includes an extraction wire 54 (an extraction member) extracting heat from the heat dissipation layer 55 toward outside. In plan view (see the illustration (b) in FIG. 9), the heat dissipation layer 55 overlaps the light-emitting element ES. In plan view, the thermal insulation layer 50 surrounds the heat dissipation layer 55. The extraction wire 54 is formed to connect to the heat dissipation layer 55, extend to an end of the display device 2, and overlap the thermal insulation layer 50 in plan view. The heat dissipation layer 55 formed to overlap the thermal insulation layer 50 can efficiently dissipate heat from the heat dissipation layer 55 toward the outside environment. The extraction wire 54 is formed of the same material as that of such wires as the gate wire GH and the source wire SH. Note that the extraction wire 54 is preferably provided across the thermal insulation layer 56 from the light-emitting element layer 5 in order to keep heat from transmitting to the light-emitting element layer 5.

Figure 10:
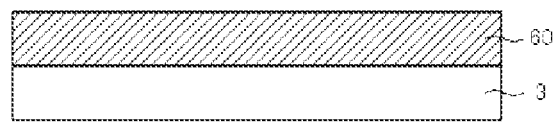
FIG. 10 is a drawing showing steps of producing a heat dissipation layer illustrated in FIG. 9. Illustrations (a) to (d) in FIG. 10 are cross-sectional views sequentially showing the steps of producing the heat dissipation layer.
Figure 10:
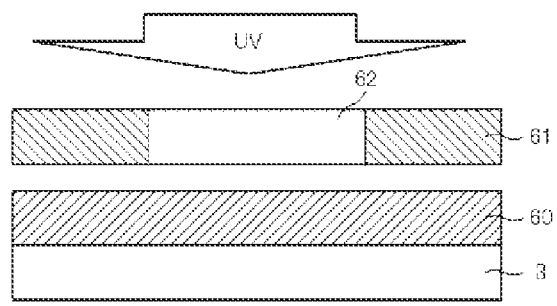
Figure 10:
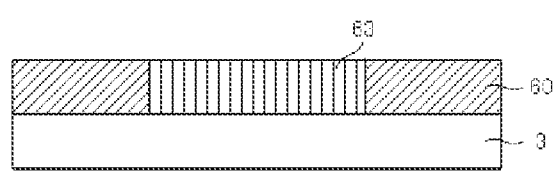
Figure 10:
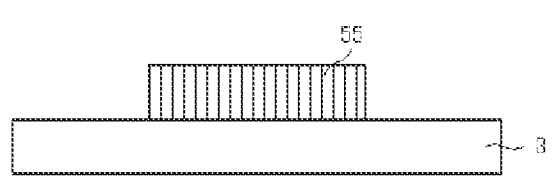

Described below is how to form the heat dissipation layer 55, with reference to the illustrations (a) and (b) in FIG. 9, and illustrations (a) to (d) in FIG. 10. FIG. 10 is a drawing showing steps of producing the heat dissipation layer illustrated in FIG. 9. The illustrations (a) to (d) in FIG. 10 are cross-sectional views sequentially showing the steps of producing the heat dissipation layer.

First, as the illustration (a) in FIG. 9 shows, the thermal insulation layer 50 is formed on the resin layer 12 and the barrier layer 3 is formed on the thermal insulation layer 50, in the same manner as the first embodiment. Next, as the illustrations (a) and (b) in FIG. 9 show, the extraction wire 54 is formed on the barrier layer 3. Meanwhile, a solution is prepared. The solution contains monomers for an acrylic resin and the metal (including a metal oxide containing the metal) capable of dissipating heat. The solvent is typically an alcohol-based solvent or hexane. Here, a content of the metal (the metal oxide) with respect to the acrylic monomers in the solution ranges from 5 to 40 wt %, and more preferably from 10 to 20 wt %. Note that, in the illustration (a) in FIG. 9, the extraction wire 54 may be provided not only horizontally, but also vertically. Moreover, the extraction wire 54 to be provided is not only one for each direction. The extraction wire 54 may include two or more extraction wires 54. Furthermore, the extraction wire 54 is not only linear, but also bent and curved. The bent and curved extraction wire 54 can readily reduce entry of foreign objects such as water and oxygen.

Next, the above solution is applied to the barrier layer 3. As the illustration (a) in FIG. 10 shows, a metal-contained acrylic monomer layer 60 is formed on the barrier layer 3. After that, as the illustration (b) in FIG. 10 shows, the metal-contained acrylic monomer layer 60 is irradiated with an ultraviolet ray through an opening 62 of a mask 61. Hence, as the illustration (c) in FIG. 10 shows, the ultraviolet ray photo-polymerizes metal-contained acrylic monomers in an ultraviolet-irradiated portion 63 of the metal-contained acrylic monomer layer 60, so that the ultraviolet-irradiated portion 63 becomes a metal-contained acrylic resin. After that, as the illustration (d) in FIG. 10 shows, unreacted metal-contained acrylic monomers (a portion of the metal-contained acrylic monomer layer 60 other than the ultraviolet-irradiated portion 63) is washed away with such a solvent as alcohol and hexane. Consequently obtained is the heat dissipating layer 55 left on the barrier layer 3 and made of the metal-contained acrylic resin of the ultraviolet-irradiated portion 63.

Note that the method for forming the heat dissipation layer 55 shall not be limited to the above one. Alternatively, for example, the dissipation layer 55 may be attached in the form of a film, or may be deposited by coating.

EXAMPLES

Described below are advantageous effects of the thermal insulation layer 50, with reference to examples and comparative examples. Note that the examples below are just examples of the embodiments, and the embodiments shall not be limited to the examples below.

Furthermore, in the descriptions below, an OLED element (an organic EL element) is used as the light-emitting element ES. The descriptions show the results of verification tests examining deterioration (deterioration in brightness) of the organic EL element.

First Example

First, an ethanol solution was prepared. The ethanol solution contained a cellulosic resin of 5 wt % represented by the structural formula (1). Added to the ethanol solution was $MoO_3$, a metal oxide, of 3 wt % with respect to the cellulosic resin. The ethanol solution was stirred well to be a mixture containing the cellulosic resin and $MoO_3$.

Next, in the first example, as described in the second embodiment, the above mixture was applied by ink-jet printing to an upper face of a polyimide substrate (the resin layer 12) provided with an OLED element. The resin layer 12 was fired and dried, so that the display device 2 illustrated in FIG. 4 was formed.

The OLED element of the display device 2 underwent an operation test at 70° C., and a decrease in brightness characteristic of the OLED element was traced. Measured in the operation test was a time period (hereinafter "deteriorating time period") in which the brightness of the OLED element decreased to 90% of its initial brightness.

Second Example

The display device 2 was formed under the same condition as that of the first example except that the amount of added $MoO_3$ with respect to the cellulosic resin in the first example was changed to 5 wt %. The deteriorating time period was measured using the same method as that in the first example.

Third Example

The display device 2 was formed under the same condition as that of the first example, except that the amount of added $MoO_3$ with respect to the cellulosic resin in the first example was changed to 10 wt %. The deteriorating time period was measured using the same method as that in the first example.

Fourth Example

The display device 2 was formed under the same condition as that of the first example, except that the amount of added $MoO_3$ with respect to the cellulosic resin in the first example was changed to 20 wt %. The deteriorating time period was measured using the same method as that in the first example.

First Comparative Example

The display device 2 was formed for a comparison purpose, under the same condition as that of the first example, except that the thermal insulation layer 50 in the first example was formed only of the cellulosic resin without adding the metal oxide or the metal carbonyl compound to the cellulosic resin (i.e. the amount of the metal oxide or the metal carbonyl compound to be added was zero). The deteriorating time period was measured using the same method as that in the first example.

Second Comparative Example

The display device 2 was formed for a comparison purpose under the same condition as that of the first example, except that, instead of the metal oxide or the metal carbonyl compound in the first example, single-element molybdenum fine particles of 5 wt % with respect to the cellulosic resin were added to the cellulosic resin. The deteriorating time period was measured using the same method as that in the first example.

Third Comparative Example

The display device 2 was formed for a comparison purpose under the same condition as that of the first example, except that the thermal insulation layer 50 formed in the first example was omitted. The deteriorating time period was measured using the same method as that in the first example.

Table 1 shows the deteriorating time periods measured in the first to fourth examples and the first to third comparative examples.

TABLE 1

|  | Deteriorating Time Period (h) |
| --- | --- |
| First Example | 92 |
| Second Example | 110 |
| Third Example | 104 |
| Fourth Example | 105 |
| First Comparative Example | 74 |
| Second Comparative Example | 75 |
| Third Comparative Example | 68 |

Fifth Example

In a fifth example, $MoO_3$, a metal oxide used in the first example, was replaced with $W(CO)_6$, a metal carbonyl compound. In the fifth example, a butyl cellosolve solution was prepared. The butyl cellosolve solution contained a cellulosic resin of 5 wt % represented by the structural formula (1). Added to the butyl cellosolve solution was $W(CO)_6$ of 3 wt % with respect to the cellulosic resin. The butyl cellosolve solution was stirred well to be a mixture containing the cellulosic resin and $W(CO)_6$.

Next, in the fifth example, as described in the fourth embodiment, the above mixture was applied by ink-jet printing to an upper face of the sealing film 6 and an upper face of a polyimide substrate (the resin layer 12) provided with an OLED element. The sealing film 6 and the resin layer 12 were fired and dried, so that the display device 2 illustrated in FIG. 7 was formed. Other than that, the display device 2 was formed for a comparison purpose under the same condition as that of the first example. The deteriorating time period was measured using the same method as that in the first example.

Sixth Example

In a sixth example, the display device 2 was formed under the same condition as that of the fifth example, except that the amount of added $W(CO)_6$ with respect to the cellulosic resin was changed to 5 wt %. The deteriorating time period was measured using the same method as that in the first example.

Seventh Example

The display device 2 was formed under the same condition as that of the fifth example, except that the amount of added $W(CO)_6$ with respect to the cellulosic resin in the sixth example was changed to 10 wt %. The deteriorating time period was measured using the same method as that in the first example.

Eighth Example

The display device 2 was formed under the same condition as that of the fifth example, except that the amount of added $W(CO)_6$ with respect to the cellulosic resin in the sixth example was changed to 20 wt %. The deteriorating time period was measured using the same method as that in the first example.

Fourth Comparative Example

The display device 2 was formed for a comparison purpose, except that the thermal insulation layer 50 in the fifth example was formed only of the cellulosic resin without adding the metal oxide or the metal carbonyl compound to the cellulosic resin (i.e. the amount of the metal oxide or the metal carbonyl compound to be added was zero). The deteriorating time period was measured using the same method as that in the first example.

Fifth Comparative Example

The display device 2 was formed for a comparison purpose under the same condition as that of the fifth example, except that, instead of the metal oxide or the metal carbonyl compound in the fifth example, single-element molybdenum fine particles of 5 wt % with respect to the cellulosic resin were added to the cellulosic resin. The deteriorating time period was measured using the same method as that in the first example.

Table 2 shows the deteriorating time periods measured in the fifth to eighth examples and the fourth and fifth comparative examples.

TABLE 2

|  | Deteriorating Time Period (h) |
| --- | --- |
| Fifth Example | 86 |
| Sixth Example | 103 |
| Seventh Example | 105 |
| Eighth Example | 110 |
| Fourth Comparative Example | 74 |
| Fifth Comparative Example | 66 |

The results in Tables 1 and 2 show that, compared with a case where no the thermal insulation layer 50 is formed as seen in the third comparative example, forming the thermal insulation layer 50 containing the cellulosic resin and the metal oxide or the metal carbonyl compound can retard deterioration of the light-emitting element ES (the OLED element). The results in Tables 1 and 2 also show that, in comparison between the display devises 2 made of the same materials, forming the thermal insulation layer 50 containing the cellulosic resin and the metal oxide or the metal carbonyl compound can retard deterioration of the light-emitting element ES (the OLED element), compared with the cases where neither the metal oxide nor the metal carbonyl compound is used as seen in the first comparative example or the fourth comparative example, where the single-element molybdenum fine particles are used as seen in the second comparative example, and where the single-element tungsten fine particles are used as seen in the fifth comparative example. Moreover, the results of the first to eight examples show that the amount of the metal oxide or the metal carbonyl compound to be added with respect to the cellulosic resin is set within a range from 3 to 20 wt %, so that the thermal insulating effect increases. Compared with the case where the amount of the metal oxide or the metal carbonyl compound to be added is out of the above range, the metal oxide or the metal carbonyl compound within the amount range can significantly retard deterioration of the light-emitting element ES, and keep display characteristics from deteriorating because of such adverse effects as scattering light.

Furthermore, the result of the second comparative example shows that molybdenum agglutinates when used not as an oxide but as a single element. That is why sufficient thermal insulating effect cannot probably be obtained. Likewise, the result of the fourth comparative example shows that tungsten agglutinates when used not as a carbonyl compound but as a single element. That is why sufficient thermal insulating effect cannot probably be obtained. For example, such inorganic fine particles (metal fine particles) as molybdenum, tungsten, and tantalum are capable of absorbing heat, and are themselves thermal insulating. However, the results of the intensive study conducted by the inventors of the disclosure show that even though such a single-element metal is dispersed into the resin in such a small amount not to color the resin or scatter light, the metal is confirmed not to be uniformly dispersed but to be unevenly distributed into the resin. As a result, the use of the single-element metal fails to achieve a sufficient thermal insulating effect.

Moreover, the results of the intensive study conducted by the inventors of the disclosure show that the thermal insulation layer 50 formed of the metal oxide or the metal carbonyl compound alone causes a significant decrease in transmittance, greatly deteriorating display capability. Meanwhile, as described above, for example, if the amount of the metal oxide or the metal carbonyl compound to be added with respect to the cellulosic resin is set within the range from 3 to 20 wt % when the air transmittance was 100%, the transmittance of the thermal insulation layer 50 is confirmed to reliably mark 95% or above.

As can be seen, this embodiment can provide the display device 2 insulating the light-emitting element ES against outside heat (keeping outside heat from transmitting to the light-emitting element ES), making it possible to retard deterioration of the light-emitting element ES.

The disclosure shall not be limited to the embodiments described above, and can be modified in various manners within the scope of claims. For example, the technical aspects disclosed in different embodiments are to be appropriately combined together to implement another embodiment. Such an embodiment shall be included within the technical scope of the disclosure. Moreover, the technical aspects disclosed in each embodiment may be combined to achieve a new technical feature.

Advantageous Effects of Invention

The disclosure is useful for a display device capable of retarding deterioration of a light-emitting element even if the display device is used under a hot environment.

The invention claimed is:
1. A display device, comprising:
a substrate;
a thin-film transistor (TFT) layer provided on the substrate;
a light-emitting element layer provided on the TFT layer and including a plurality of light-emitting elements; and
at least one thermal insulation layer,
the at least one thermal insulation layer comprising:
a cellulosic resin; and
a metal oxide or a metal carbonyl compound.

2. The display device according to claim 1, wherein the metal oxide or the metal carbonyl compound comprises any one of Molybdenum (Mo), Tungsten (W), Tantalum (Ta), and Niobium (Nb).

3. The display device according to claim 1, wherein the metal oxide is Molybdenum Oxide or Niobium Oxide.

4. The display device according to claim 1, wherein the metal carbonyl compound is Tungsten Carbide Oxide.

5. The display device according to claim 1, wherein in the at least one thermal insulation layer, a content of the metal oxide or the metal carbonyl compound with respect to the cellulosic resin ranges from 3 to 20 wt %.

6. The display device according to claim 1, further comprising:
a sealing film provided on the light-emitting element layer, wherein
the at least one thermal insulation layer is an organic insulating layer,
and
the sealing film includes a first inorganic insulating layer, the organic insulating layer, and a second inorganic insulating layer stacked on top of each other in a stated order from the light-emitting element layer.

7. The display device according to claim 1, further comprising
a sealing film provided on the light-emitting element layer, wherein
the at least one thermal insulation layer covers the sealing film.

8. The display device according to claim 1, wherein the at least one thermal insulation layer is provided on the TFT layer toward the substrate.

9. The display device according to claim 1, further comprising:
a moisture proof film provided above the substrate, wherein
the at least one thermal insulation layer is provided between the substrate and the moisture proof film.

10. The display device according to claim 1, wherein the at least one thermal insulation layer is provided across the substrate from the TFT layer.

11. The display device according to claim 1, further comprising:
a heat dissipation layer configured to dissipate heat from the plurality of light-emitting elements, wherein
the TFT layer is formed between the heat dissipation layer and the light-emitting element layer.

12. The display device according to claim 11, further comprising:
an extraction member connected to the heat dissipation layer and configured to extract the heat toward outside, wherein, in a plan view,
the heat dissipation layer overlaps the plurality of light-emitting elements,
the at least one thermal insulation layer surrounds the heat dissipation layer, and
the extraction member is formed to overlap the at least one thermal insulation layer.

13. The display device according to claim 11, wherein the heat dissipation layer is made of a material comprising an acrylic resin into which inorganic fine particles are dispersed.

14. The display device according to claim 13, wherein the inorganic fine particles are of at least one kind selected from a group of such a substance as silver, copper, aluminum, magnesium, tin, and silicon, and an oxide of the substance.

15. The display device according to claim 13, wherein in the material of the heat dissipation layer, a content of the inorganic fine particles with respect to the acrylic resin ranges from 5 to 40 wt %.

16. The display device according to claim 1, wherein the substrate is a flexible substrate.

17. The display device according to claim 1, wherein the substrate is a resin layer comprises at least one resin selected from a group of polyimide, polyamide, polyester, and acrylic resin.

18. A display device, comprising:
a substrate;
a thin film transistor (TFT) layer provided on the substrate;
a light-emitting element layer provided on the TFT layer and including a plurality of light-emitting elements;
at least one thermal insulation layer; and
a heat dissipation layer configured to dissipate heat from the light-emitting element layer, wherein
the at least one thermal insulation layer comprises:
a cellulosic resin;
a metal oxide or a metal carbonyl compound; and
a first thermal insulation layer, and
the heat dissipation layer is formed between the thin film transistor layer and the first thermal insulation layer.

19. A display device, comprising:
a substrate;
a thin film transistor (TFT) layer provided on the substrate;
a light-emitting element layer provided on the TFT layer and including a plurality of light-emitting elements;
at least one thermal insulation layer;
a heat dissipation layer configured to dissipate heat from the light-emitting element layer; and
an extraction member connected to the heat dissipation layer and configured to extract the heat toward outside, wherein,
the at least one thermal insulation layer comprises:
a cellulosic resin;
a metal oxide or a metal carbonyl compound; and
a second thermal insulation layer,
the heat dissipation layer overlaps a light-emitting element of the plurality of light-emitting elements in a plan view, and
the second thermal insulation layer surrounds the heat dissipation layer in the plan view.

* * * * *